United States Patent [19]

Houston et al.

[11] Patent Number: 5,053,848
[45] Date of Patent: Oct. 1, 1991

[54] APPARATUS FOR PROVIDING SINGLE EVENT UPSET RESISTANCE FOR SEMICONDUCTOR DEVICES

[75] Inventors: Theodore W. Houston; Ping Yang, both of Richardson, Tex.

[73] Assignee: Texas Instruments Incorporated, Dallas, Tex.

[21] Appl. No.: 285,440

[22] Filed: Dec. 16, 1988

[51] Int. Cl.[5] .......................................... H01L 27/02
[52] U.S. Cl. ..................... 357/51; 357/23.1; 357/23.6; 357/67; 357/71; 365/154; 365/156
[58] Field of Search ................ 357/51, 23.5, 23.6, 357/67 S, 71 S, 59 I, 23.1; 365/154, 156, 190

[56] References Cited

U.S. PATENT DOCUMENTS

| | | | |
|---|---|---|---|
| 3,649,884 | 3/1972 | Haneta | 357/23.5 |
| 4,003,034 | 1/1977 | Au | 357/23.6 |
| 4,080,618 | 3/1978 | Tango et al. | 357/51 |
| 4,481,524 | 11/1984 | Tsujide | 357/51 |
| 4,519,126 | 5/1985 | Hsu | 357/71 S |
| 4,536,944 | 8/1985 | Bracco et al. | 357/23.5 |
| 4,782,467 | 11/1988 | Balt et al. | 365/154 |
| 4,873,557 | 10/1989 | Kita | 357/23.11 |

FOREIGN PATENT DOCUMENTS

| | | | |
|---|---|---|---|
| 60-45067 | 3/1985 | Japan | 357/23.5 |
| 0224461 | 10/1986 | Japan | 357/23.5 |
| 0140472 | 6/1987 | Japan | 357/23.5 |

OTHER PUBLICATIONS

IBM Technical Disclosure Bulletin, "Process for Fabricating Lightly Doped Drain MOS Devices with Punch-Through Stoppers", vol. 27, No. 11, 4/1985.

Chen et al., TiSi$_2$ Thickness Limitations for Use with Shallow Junctions and Swami or Locos Isolation, IEEE Transactions on Electrons Device, vol. ED-33, No. 10, Oct. 1986.

IEEE Transactions on Electron Devices, vol. Ed-34 No. 3, Mar. 1987, p. 562, "Titanium Disilicide Contact Resistivity and Its Impact on 1-$\mu$m CMOS circuit performance".

A. Ochaoa, Jr., et al., "A Proposed New Structure for SEU Immunity in SRAM Employing Drain Resistance", IEEE Electron Device Letters, vol. EDL-8, No. 11, Nov. 1987, pp. 537-539.

Primary Examiner—Rolf Hille
Assistant Examiner—Minhloan Tran
Attorney, Agent, or Firm—Stanton C. Braden; James T. Comfort; Melvin Sharp

[57] ABSTRACT

A method for preventing single event upsets (SEUs) in MOS circuits is disclosed. A resistive area (88, 89) is situated in a semiconductor device such that when a high energy particle passes through the device and the resistive area (88, 89) the stray carriers caused by the particle will pass through the resistive area (88, 89) causing a voltage drop which will prevent the upset of the MOS circuit. A low resistance path is provided for the normal operating current in the device so that the normal operating parameters of the device are not affected by the protection provided by the resistive area (88, 89).

5 Claims, 2 Drawing Sheets

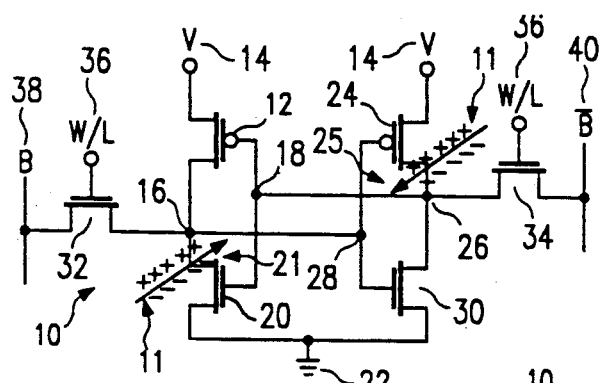
FIG. 1a (PRIOR ART)
FIG. 3
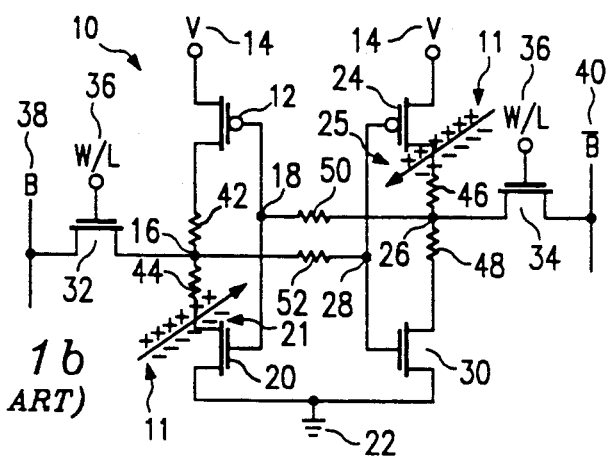
FIG. 1b (PRIOR ART)
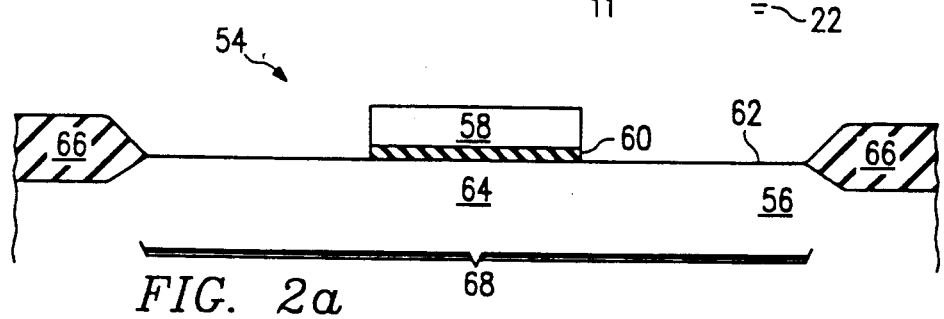
FIG. 2a
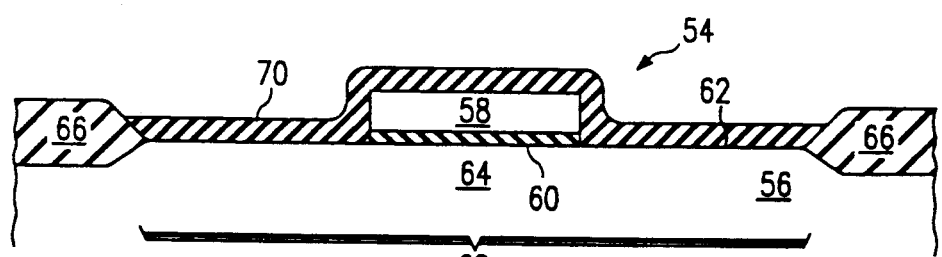
FIG. 2b
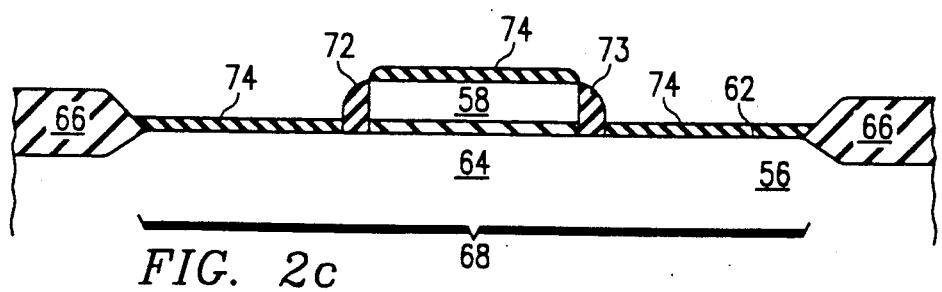
FIG. 2c

APPARATUS FOR PROVIDING SINGLE EVENT UPSET RESISTANCE FOR SEMICONDUCTOR DEVICES

This invention was made with Government support under contract number DNA001-86-C-0090 awarded by the Defense Nuclear Agency.

TECHNICAL FIELD OF THE INVENTION

This invention relates in general to the field of MOS semiconductor devices. Specifically, the present invention relates to a method and apparatus for preventing MOS semiconductor devices from experiencing single event upsets (SEUs) as a result of the passage of high-energy particles through the devices.

BACKGROUND OF THE INVENTION

One of the most difficult problems encountered in the design, construction and operation of semiconductor devices is the constant bombardment of the device with natural high-energy particles. A variety of radiation, including alpha particles, gamma rays and high-energy ions, constantly bombard the surface of the earth and are found in far greater numbers in outer space. These particles can be extremely destructive in the microscopic context of a semiconductor device. As high-energy particles or ions pass through a semiconductor layer, they leave in their wake a trail of electron-hole pairs. These electron-hole pairs constitute a source of stray carriers. If they are present in the wrong spot in a circuit at the wrong time, they can cause errors in such devices as memory cells, latches, and other logic circuits. These errors are known as single-event upsets or SEUs.

To prevent single event upsets, conventional resistors are usually added to a circuit to slow the propagation of voltage change caused by the collection of the stray carriers through the addition of an RC delay factor. However, these resistors also slow all other carriers in the device and thereby slow its operating speed. This is especially apparent in memory devices where access time ("READ" time) and programming time ("WRITE" time) of the memory component are two of the chief limiting factors to the speed of operation of an integrated electronic system.

Therefore, a need exists for a method and apparatus for protecting semiconductor devices from single event upsets which do not slow the normal operation of the device.

SUMMARY OF THE INVENTION

One aspect of the invention comprises an integrated circuit device formed in a semiconductor layer to include a high-resistance region. A low-resistance region is formed adjacent the high-resistance region so that normal device operating current may pass easily through the device. The high-resistance region is disposed such that a high-energy particle passing through the device will pass through the low and high-resistance regions. The stray carriers created along the path of the particle have to pass through the high-resistance region and the voltage drop caused as the carriers pass prevents the upset of the device.

A technical advantage of the present invention is that resistance is placed in a semiconductor device such that the resistance diminishes the effect of stray carriers created by the passage of a high-energy particle through the device.

A further technical advantage of the present invention is that the resistance is placed in the semiconductor device such that it does not affect the normal operation of the device. This is accomplished by placing the resistance in the path of any high-energy particles but outside the path of the normal operating current of the device.

BRIEF DESCRIPTION OF THE DRAWINGS

A more complete understanding of the present invention may be derived by referring to the detailed description and claims when considered in connection with the accompanying drawings in which like reference numbers indicate like features, wherein:

FIG. 1a is a circuit diagram of a prior art CMOS SRAM cell comprising cross coupled inverters which is not protected from SEUs;

FIG. 1b is a circuit diagram of a prior art CMOS SRAM cell comprising cross coupled inverters and showing prior art solutions to the SEU problem;

FIGS. 2a through 2h are highly magnified elevational schematic cross sectional diagrams that depict the processing steps necessary to build a field effect transistor according to one embodiment of the present invention; and FIG. 3 shows a voltage versus current curve applicable to the Schottky contact of titanium disilicide with a lightly doped semiconductor region in accordance with the present invention.

DETAILED DESCRIPTION OF THE INVENTION

Figure 2D:
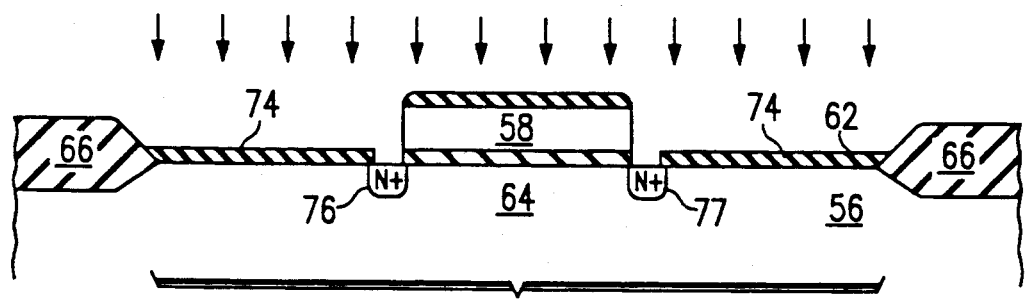

Important technical advantages of the present invention can best be understood when examined in the context of its application to specific circuits. Further, an understanding of previous attempts to solve the problems addressed by the present invention is essential to the understanding of the present invention.

Accordingly, FIG. 1a represents a prior art circuit indicated generally at 10, which when constructed in a semiconductor layer, is sensitive to single event upsets. This circuit is a CMOS SRAM memory cell comprising cross-coupled inverters each having a P-channel and an N-channel field effect transistor [FET]. A first P-channel FET 12 has its source connected to a voltage source 14, its drain connected to a first drain node 16 and its gate connected to a first gate node 18. A first N-channel FET 20 has its drain connected to first drain node 16, its gate connected to first gate node 18 and its source connected to a voltage source 22. A second P-channel FET 24 has its source connected to voltage source 14, its drain connected to a second drain node 26 and its gate connected to a second gate node 28. A second N-channel FET 30 has its drain connected to second drain node 26, its gate connected to second gate node 28 and its source connected to voltage source 22.

Input and output to memory cell circuit 10 are controlled by a first access FET 32 and a second access FET 34. First access FET 32 has its drain connected to first drain node 16, its gate connected to a word line 36 and its source connected to a bit line 38. Second access FET 34 has its drain connected to second drain node 26, its gate connected to word line 36 and its source connected to a second bit line 40. Memory cell circuit 10 is cross-coupled by connecting first gate node 18 to second drain node 26 and by connecting first drain node 16 to second gate node 28.

Memory cell circuit 10 is capable of being in two possible static states corresponding to two possible information states. In the first of these information states, the first drain node 16 is held at a voltage level substantially equal to the level of voltage source 14, and the second drain node 26 is held at a voltage level substantially equal to that of voltage source 22. In this state, first P-channel FET 12 is in its conductive mode or "on", second P-channel FET 24 is in its nonconductive mode or "off", first N-channel FET 20 is off and second N-channel FET 30 is on.

In the second possible information state, the first drain node 16 is held at a voltage level approximately equal to the level of voltage source 22 and second drain node 26 is held at a voltage level approximately equal to the level of voltage source 14. In this second state, first P-channel FET 12 is off, second P-channel FET 24 is on, first N-channel FET 20 is on and second N-channel FET 30 is off.

The passage of a high-energy particle through crucial points in the circuit 10 can cause the circuit to change memory states. For example, if memory cell circuit 10 is in the first state described above, with first P-channel FET 12 on and first N-channel 20 off, a high-energy particle 11 passing through either the drain region 21 of first N-channel FET 20 or the drain region 25 of second P-channel FET 24 could create electron-hole pairs in its path sufficient to cause an upset. For example, if the particle passes through the drain region 21 of first N-channel FET 20, enough current is created that first drain node 16 is pulled toward the level of voltage source 22. Consequently, second gate node 28 is also pulled toward the level of voltage source 22, and if this voltage level drops sufficiently, second N-channel FET 30 will turn off and second P-channel FET 24 will turn on. If these transistors switch as described, second drain node 26 will be pulled toward the level of voltage source 14 causing first P-channel FET 12 and first N-channel 20 to also switch, completing the inversion of the memory cell state.

The mechanism described above to change the information state of the memory cell described is merely one possible manner in which a single event upset might occur. Any time a particle, of sufficient energy passes through a vulnerable area of a transistor which is currently in a non-conductive mode, such an upset of the memory cell is possible.

Circuit 10 is clearly not the only circuit susceptible to errors created by high energy particles. Any time a circuit relies on a transistor remaining in a certain state, or on a certain charge accumulation existing in a particular area of the semiconductor, the stray carriers caused by the passage of a high-energy particle have the capability of creating this sort of upset. Consequently, it should be understood that the illustrated circuit 10 is merely exemplary and is used to show technical advantages of the invention. The invention is applicable, however, to any integrated circuit susceptible to such single event upsets.

To understand key technical advantages of the present invention, it is necessary to understand the principles of prior preventative measures. One method used in the prior art to protect memory cell circuit 10 from single event upsets is shown in FIG. 1b. FIG. 1b represents a diagram of a circuit which is identical to the circuit represented in FIG. 1a with the addition of protective resistors 42, 44, 46, 48, 50 and 52.

Protective resistors 50 and 52 work to slow the propagation of voltage change caused by the collection of stray carriers from first input node 16 to second gate node 28 and from second input node 26 to first gate node 18 by introducing an RC delay into the circuit. In the example described above, this delay allows drain voltage source 14 to restore first input node 16 to its original voltage level after it had been pulled toward the level of voltage source 22 by the influx of the stray carriers. If this voltage level can be restored before the voltage on gate node 18 changes, an upset of the memory cell can be prevented. Protective resistor 50 serves the same protective function for the case where the particle strikes the drain region 25 of second P-channel FET 24.

The problem with the preventative measure described above is that the RC delay created by protective resistors 50 and 52 decreases the speed at which the memory cell can be programmed. As a result, the time at which a particular node within the cell must be held at a certain voltage level in order to program the cell increases and thereby slows the operating speed of any integrated system of which the memory cell is a component.

According to a second preventative measure that has been used in the past, protective resistors 42, 44, 46 and 48 introduce a further propagation delay. However, these resistors are primarily used to create a voltage divider within the circuit itself. Under prior art preventative measures, resistors 42, 44, 46 and 48 would not all be used in one cell. Resistors 42 and 46 would be used together with resistors 50 and 52 in one configuration or resistors 44 and 48 would be used together with resistors 50 and 52 for a second configuration.

Referring again to the circuit in FIG. 1b, if a particle 11 travels through the drain region 21 of first N-channel FET 20 creating stray carriers in its path, the current created by these carriers must pass through protective resistor 44. The current passing through the resistor 44 creates an IR voltage drop. If protective resistor 44 is large enough, the voltage at first input node 16 can be maintained at a level sufficiently above voltage source 22 to prevent second N-channel FET 30 from switching off. Thus, this resistor and the corresponding voltage drop would interrupt the upset sequence of the memory cell and prevent the cell from changing to an erroneous state.

Resistors 42 and 46 would be used to prevent an upset resulting from a high-energy particle striking either P-channel FET 12 or 24 with resistors 44 and 48 not present in the circuit. Resistors 44 and 48 would be used to prevent an upset resulting from a high-energy particle striking either N-channel FET 20 or 30 with resistors 42 and 46 not present in the circuit. In either of these prior art preventative measures, resistors 50 and 52 must be included to protect against a high-energy particle striking the unprotected pair of FETs. Hence, in either of these prior art methods, resistors 50 and 52 would slow the operation of a device using these protective measures.

The problem with the introduction of protective resistors 42, 44, 46 and 48 in the legs of the inverters as shown in FIG. 1b is that they further slow down the operation of the device as described above.

An important technical advantage of the present invention is that it prevents the upset of the memory cell by providing the voltage drop necessary for this voltage divider effect in such a manner that the resistance exists along the path of the high-energy particle where the stray carriers accumulate, but such that the resistance does not exist in the path of the normal operating current of the device.

FIGS. 2a through 2h show a greatly enlarged, not necessarily to scale, cross sectional side view of the process steps necessary to create one possible embodiment of the invention, a field effect transistor 54 built on a semiconductor substrate 56. Field effect transistor 54 is an N-channel device. Referring first to FIG. 2a, substrate 56 is accordingly lightly doped to be P-type. Field effect transistor 54 resides in an active region 68 of substrate 56 surrounded by a field oxide layer 66.

To construct field effect transistor 54, a gate insulator layer (not shown) is grown on an outer surface 62 of substrate 56 and a layer of polycrystalline or amorphous silicon (not shown) is deposited on this gate insulator layer. These two layers are patterned and etched by conventional methods to form a gate insulator layer 60 and a gate conductor 58. Gate insulator layer 60 is disposed over a channel region 64. Gate conductor 58 serves to actuate channel region 64 when field effect transistor 54 is on.

In the next step, as shown in FIG. 2b, a nitride layer 70 is deposited over active region 68. Nitride layer 70 is then anisotropically etched to form sidewall nitride filaments 72 and 73 shown in FIG. 2c. In the next step, also shown in FIG. 2c, an oxide layer 74 is grown on the exposed portions of outer surface 62 of substrate 56, as well as the outer surface of gate conductor 58.

As shown in FIG. 2d, sidewall nitride filaments 72 and 73 are then stripped using a process selective to nitride exposing outer surface 62 of substrate 56 immediately adjacent each side of gate oxide 60. Coupling wells 76 and 77 are then implanted into upper surface 62 of substrate 56 in the areas previously occupied by sidewall nitride filaments 72 and 73.

Coupling wells 76 and 77 are shown to be N+ regions because field effect transistor 54 is an N-channel device. However, coupling wells 76 and 77 would be P+ regions if field effect transistor 54 were constructed to be a P-channel device. For an N-channel device, the implant step shown in FIG. 2d can be accomplished by an implant of phosphorus at a concentration level of 1E17. For a P-channel device, an implant of boron at the same concentration level could be used.

Figure 2E:
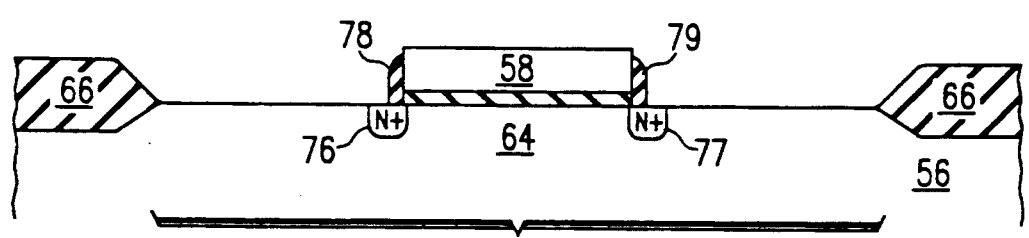

In the next step a layer of oxide (not shown) is grown or deposited on active region 68 and anisotropically etched back to form the sidewall oxide filaments 78 and 79 shown in FIG. 2e.

Figure 2F:
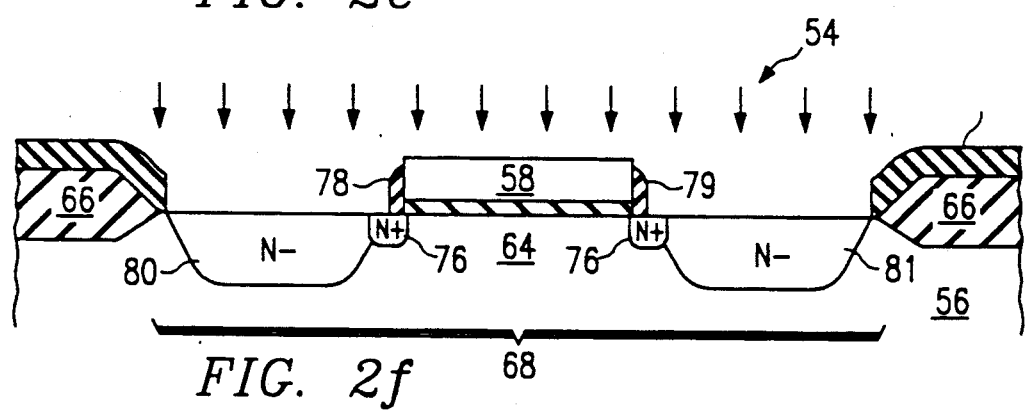

In the next step, as shown in FIG. 2f, an implant process is used to form source and drain regions 80 and 81. For an N-channel device, this implant comprises phosphorus at a concentration level of 1E15 followed by an 800° C. anneal step. For a P-channel device, boron may be used at the same concentration level followed by the same anneal process.

Figure 2G:
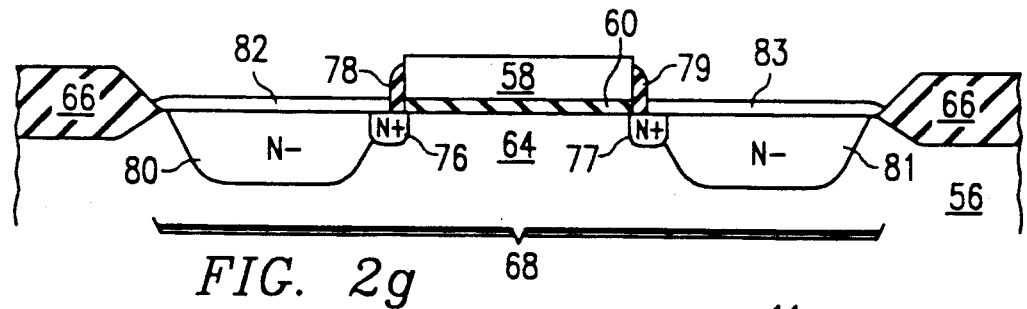

As shown in FIG. 2g, in the next step, a layer of titanium disilicide is used to form source and drain pads 82 and 83.

Figure 2H:
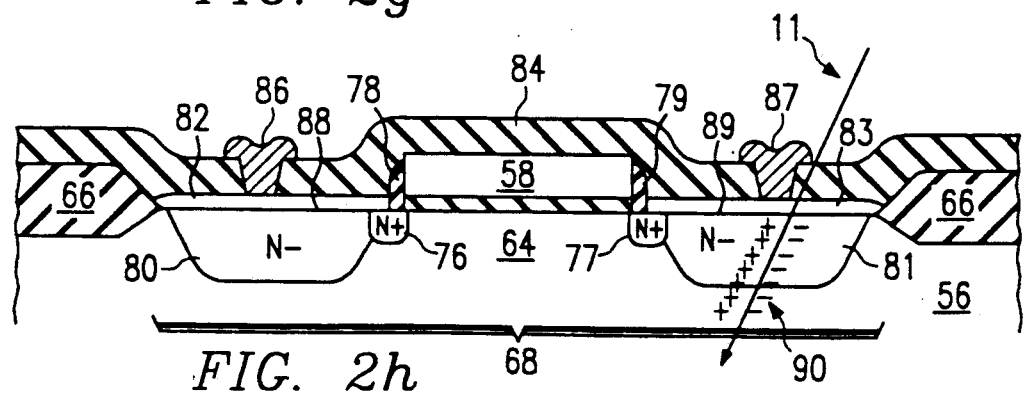

In the final production steps, a layer 84 of insulator oxide is deposited and holes are cut to provide for source and drain contacts 86 and 87 resulting in the structure shown in FIG. 2h.

The above illustrates only one possible process flow. One skilled in the art will recognize that different processes such as the use of different dielectric or gate materials could be used to accomplish a similar structure. Further, the structure could be modified, for example, to include drain profiling, and still fall within the intended scope of the present invention.

Referring to FIG. 2h, key technical advantages of the invention are apparent in this exemplary structure. Source and drain pads 82 and 83 are conductors which provide a path for current during normal operation of the transistor. Coupling wells 76 and 77 electrically connect source and drain pads 82 and 83 to channel region 64 providing a low-resistance path for current during normal operation of the transistor. Source and drain regions 80 and 81 are in Schottky contact with source and drain pads 82 and 83 at contact interfaces 88 and 89 due to the dopant concentration levels within these regions. The manner in which an exemplary high-energy particle might pass through contact interface 89 is illustrated by a pathway indicated generally at 11 in FIG. 2h. The location of the formation of electron hole pairs is also indicated generally as a collection path 90 in FIG. 2h.

The contact of semiconductor materials of various dopant concentrations with titanium disilicide is fully discussed in the article by Scott et al., "Titanium Disilicide Contact Resistivity and Its Impact on 1 $\mu$m CMOS Circuit Performance", *IEEE Transactions on Electron Devices*, Vol. ED-34, No. 3, page 562 (1987). The contact of an N- or P- region of silicon with titanium disilicide where the concentrations of dopant in the substrate are on the order of 1E15 provides a resistance of ten kiloohms across the contact region. A P-channel device constructed according to the present invention would have a saturation current of 300 microamps. An N-channel device constructed under the teachings of the present invention would have a saturation current of 600 microamps. With these parameters, a resistance of five kiloohms in the collection path 90 of a high-energy particle would make a memory cell containing field-effect transistors constructed in this manner immune to single event upsets. Hence, the ten kiloohm resistance provided by the Schottky contact of source and drain pads 82 and 83 with source and drain regions 80 and 81 will provide twice the resistance necessary for the needed immunity to single event upsets while the source and drain pads 82 and 83 and coupling wells 76 and 77 provide a low-resistance current path which allow the transistor to function without the burden of the added resistances of the prior art preventative measures.

FIG. 3 shows a typical voltage versus current curve for a Schottky contact region like the one used in the present invention. The curve shows that the contact interface demonstrates a high resistance until a relatively high voltage is placed across the region. At lower voltage levels, the resistance is fairly uniform. As discussed above, this resistance can be used to prevent the undesirable propagation of voltage changes through a circuit due to the stray carriers created by the passage of a high-energy particle through the source or drain region of a field effect transistor that is constructed according to the present invention.

In summary, the present invention teaches that the resistance necessary to prevent single event upsets in a variety of MOS circuitry can be placed in semiconductor devices in such a way that the resistances do not affect the normal operation of the circuit. One possible embodiment of the invention is a field effect transistor constructed with a Schottky contact region in each of the source and drain regions to provide for the resistance. However, alternate methods of providing this resistance could be used. For example, the source and drain regions of the transistor could be constructed using a graded implant process. This would create a resistivity gradient within the source and drain regions, with the deeper areas of the source and drain regions having higher resistance while the surface of the source and drain regions provided a high-conductivity path for the normal operation of the transistor.

Another embodiment of the present invention could use a high resistivity layer, for example germanium doped silicon, below a higher conductivity surface layer. The layer of germanium doped silicon would provide the protection from high-energy particles while the higher conductivity surface layer would provide a path for the normal operating current of the device.

Still another embodiment of the present invention could encompass the variations available through elevated transistor technologies. The construction of the components of field effect transistors outwardly from the substrate surface could easily include a layer of high resistance surrounding the source and drain regions of an elevated transistor device.

The embodiment described in FIGS. 2a through 2h, requires a minimum of masks and involves several self-aligning features which are important in reducing device size and increasing device concentration on a chip.

The foregoing description uses preferred embodiments and processes to illustrate the present invention. However, those skilled in the art will recognize that changes and modifications may be made in these embodiments without departing from the scope of the present invention. These and other modifications are intended to be included within the present invention as defined by the scope and spirit of the appended claims.

What is claimed is:

1. A single event upset resistant field effect transistor comprising:
    a drain region;
    a gate;
    a source region, said source region, gate and drain region being disposed along a line with said gate being interposed between said drain and source regions such that a region of discontinuity exists on said line between said drain region and gate, and between said source region and gate;
    first and second coupling wells of a higher dopant concentration than said source and drain regions, each of which lie along an associated region of discontinuity on said line; and
    first and second electrically conductive pads each including a cross-sectional face which lies on a plane interposed between said gate and said source and drain regions and which further lies along said line concurrently with a portion of an associated coupling well.

2. A single event upset resistant field effect transistor as recited in claim 1 wherein said first and second electrically conductive pads are comprised of silicide.

3. A single event upset resistant field effect transistor as recited in claim 2 wherein said slicide is titanium disilicide.

4. A single event upset resistant field effect transistor as recited in claim 1 which further includes sidewall filaments abutting said gate and an associated conductive pad and coupling well.

5. A single event upset resistant field effect transistor as recited in claim 1 which further includes a gate insulator interposed between the gate and the coupling wells, the source region, the drain region.

* * * * *